(12) United States Patent
Nakata

(10) Patent No.: US 6,525,610 B1
(45) Date of Patent: Feb. 25, 2003

(54) DUAL PLANE MICROSTRIP POWER AMPLIFIER

(75) Inventor: Mark A. Nakata, Simi Valley, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 32 days.

(21) Appl. No.: 09/693,065

(22) Filed: Oct. 20, 2000

(51) Int. Cl.[7] .................................................. H03F 3/60
(52) U.S. Cl. ........................ 330/286; 330/295; 330/307
(58) Field of Search ................................. 330/286, 295, 330/307, 124 R

(56) References Cited

U.S. PATENT DOCUMENTS

| | | | | |
|---|---|---|---|---|
| 4,376,287 A | * | 3/1983 | Sechi ............................ | 357/80 |
| 4,868,520 A | * | 9/1989 | Terakawa et al. ............ | 330/295 |
| 5,075,641 A | * | 12/1991 | Weber et al. ............ | 331/108 C |
| 5,329,248 A | * | 7/1994 | Izadian ........................ | 330/295 |

* cited by examiner

Primary Examiner—Robert Pascal
Assistant Examiner—Henry Choe
(74) Attorney, Agent, or Firm—Freilich, Hornbaker & Rosen

(57) ABSTRACT

A high power microwave amplifier implementation comprised of a conductive substrate defining first and second parallel planar surfaces and an edge surface extending substantially perpendicular to said planar surfaces. Output transistors are physically mounted adjacent to said edge surface enabling a heat sink to be placed in close proximity thereto. Microwave input circuitry is located adjacent to said first planar surface and microstrip output circuitry is located adjacent to said second planar surface. The substrate is mounted in a conductive housing so as to partition the housing interior volume into isolated first and second cavities respectively containing the input circuitry and output circuitry.

5 Claims, 5 Drawing Sheets

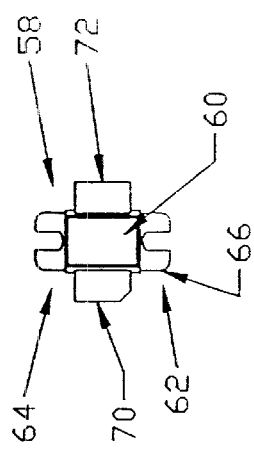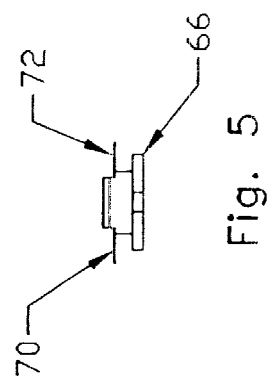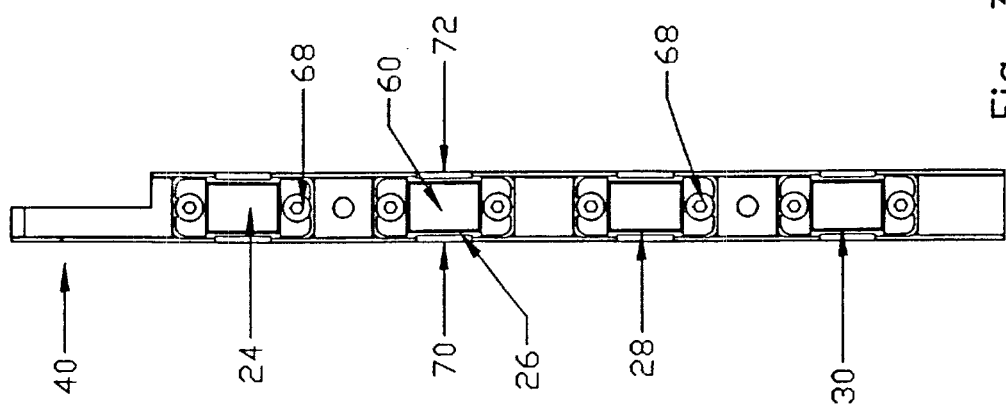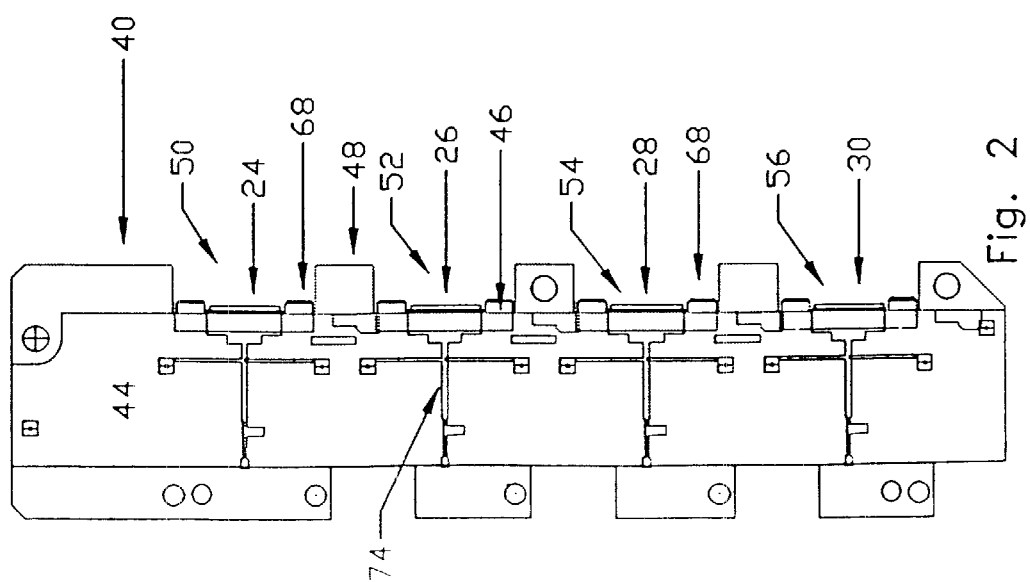

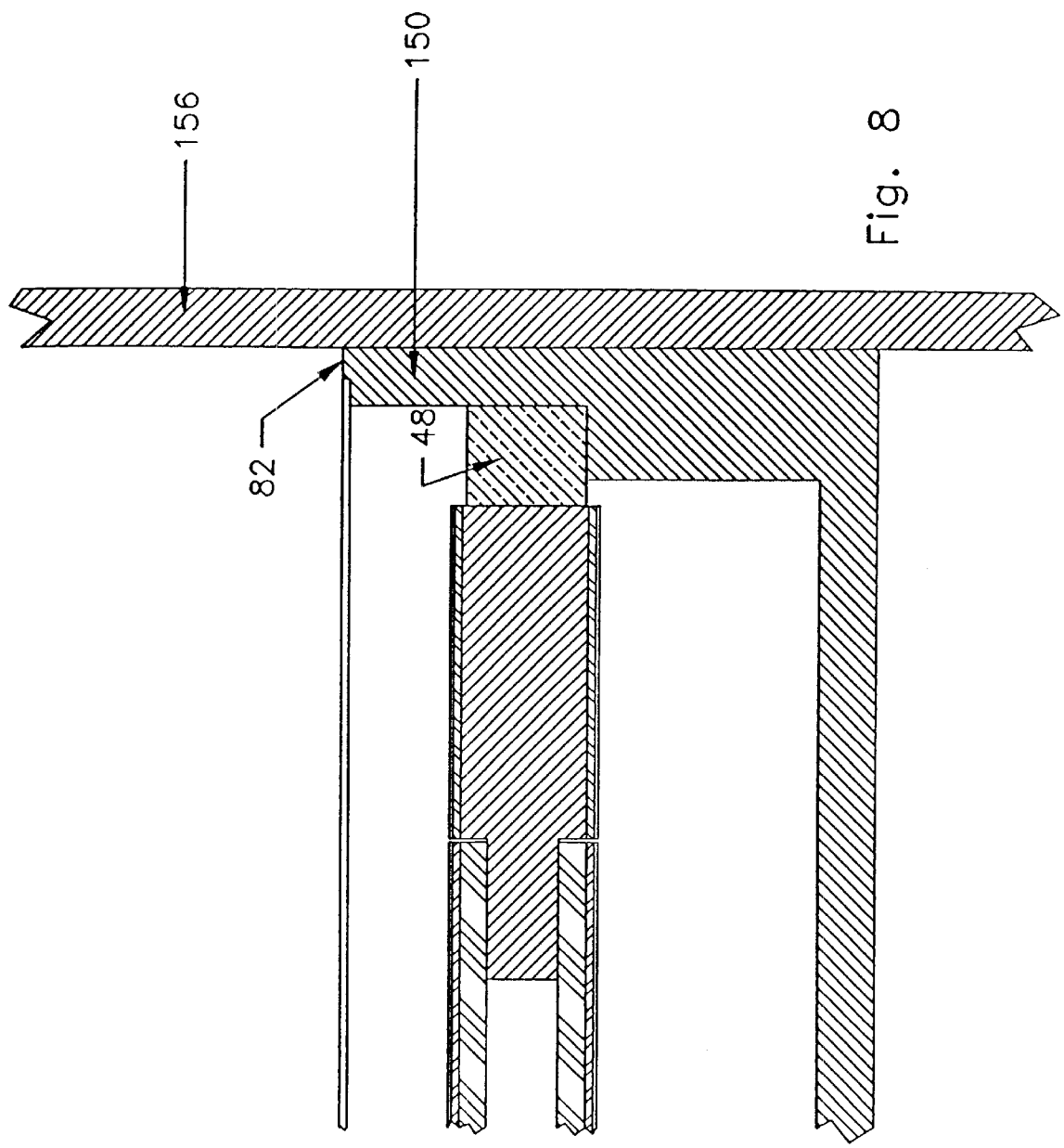

DUAL PLANE MICROSTRIP POWER AMPLIFIER

FIELD OF THE INVENTION

This invention relates generally to high power solid state amplifiers and more particularly to an improved microstrip implementation configured to enhance heat dissipation and optimize isolation between input and output circuitry.

BACKGROUND OF THE INVENTION

Conventional microwave solid state amplifiers employ microstrip transmission lines to deliver drive power to microwave output transistors and to connect the transistors to a useful output port. Many applications employ a plurality of such amplifiers arranged in modular fashion to produce high power output levels. For example only, certain microwave signal transmission systems utilize over one hundred microstrip amplifier modules to produce in excess of 70 kilowatts of power. A suitable amplifier module can use a single input transistor to drive multiple output transistors via microstrip circuitry formed on a substrate supported in a sealed housing. Conventionally, the transistors and input-output microstrip circuitry are supported adjacent a common substrate surface which bounds a common cavity in the housing. Typically, the common cavity can support many wave guide modes which can cause undesired feedback resulting in amplifier instability. Moreover, such conventionally constructed circuitry is often characterized by relatively long thermal paths between the output transistors and a heat sink surface. This can result in undesirably high transistor junction temperatures which limit power output and device reliability.

SUMMARY OF THE INVENTION

The present invention is directed to a solid state amplifier implementation comprised of a conductive substrate defining first and second parallel planar surfaces and an edge surface extending substantially perpendicular to said planar surfaces. In accordance with the invention one or more output transistors is physically mounted adjacent to said edge surface to enable a heat sink to be conveniently placed in close proximity thereto to provide a short thermal path and enhanced heat dissipation.

In accordance with a preferred embodiment of the invention, input circuitry is located adjacent to said substrate first planar surface and output circuitry is located adjacent to said substrate second planar surface. The input and output circuitry is formed, at least in part, by microstrip, i.e., strip transmission, lines, supported on respective dielectric layers deposited on the substrate first and second planar surfaces. The substrate forms a common ground plane.

In accordance with a further aspect of the preferred embodiment, the substrate bearing the output transistor(s) and input I output circuitry is mounted in a conductive housing including a removable cover plate. With the cover plate and substrate in place, the first substrate surface carrying input circuitry is contained in a first cavity isolated from the second substrate surface carrying output circuitry and contained in a second cavity. This isolation enhances amplifier stability.

BRIEF DESCRIPTION OF THE DRAWINGS

FIG. 2 is a plan view of a preferred amplifier module subassembly fabricated in accordance with the present invention;

FIG. 3 is a side view of the subassembly of FIG. 2;

FIG. 4 and 5 respectively, are plan and side views of a typical power transistor used in the subassembly of FIGS. 2 and 3;

FIGS. 7 and 8 sectional views respectively taken substantially along the planes 7—7 and 8—8 of FIG. 6.

DETAILED DESCRIPTION

Figure 1:
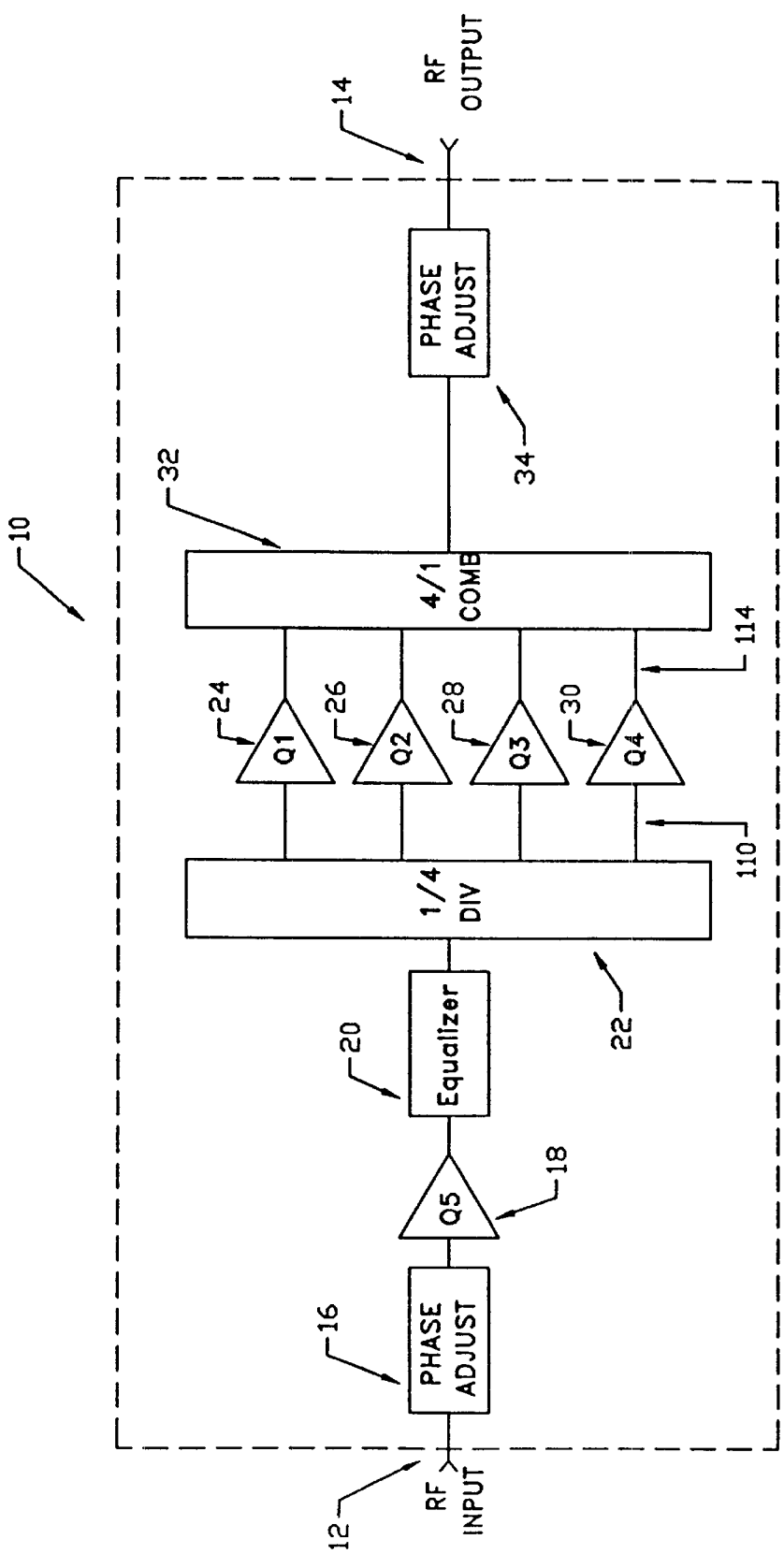
FIG. 1 is a circuit block diagram of an exemplary solid state amplifier module which can be implemented in accordance with the present invention.

Attention is initially directed to FIG. 1 which depicts a circuit block diagram exemplary of a high power solid state amplifier module 10. The module 10 includes an RF input 12 and an RF output 14. The input 12 is preferably coupled through a phase adjust circuit 16 to an input transistor 18. Input transistor 18 is connected through a gain equalizer circuit 20 to a 1/4 divider circuit 22. Thus, the input transistor 18, via the divider circuit 22, drives four output transistors 24, 26, 28, 30 connected in parallel. The output transistors are connected to a 4/1 combiner circuit 32 to deliver combined output power via a phase adjust circuit 34 to the RF output 14.

The block diagram of FIG. 1 is exemplary of a solid state amplifier module 10 for delivering significant output power, e.g., 550 watts at microwave frequencies, e.g., S band. Various microwave signal transmission systems require the use of a large number of amplifier modules in order to produce a large power output, e.g., in excess of 70 kilowatts. In such applications, it is frequently necessary to be able to mount many modules 10 of the type depicted in FIG. 1 in close proximity to one another and yet still have the ability to effectively dissipate heat therefrom. The present invention is directed to a preferred implementation which permits a large number of amplifier modules to function in very close proximity and which provides for good heat dissipation therefrom.

FIGS. 2 and 3 illustrate a preferred amplifier module subassembly 40 in accordance with the present invention for implementing the portion of the circuitry shown in FIG. 1 between the divider circuit 22 and combiner circuit 32. The plan view of subassembly 40 in FIG. 2 depicts a rigid structure 44 defining an elongate front edge 46. Spaced studs 48 project forwardly from the front edge 46 to define recessed regions 50, 52, 54, 56. Power output transistors 24', 26', 28', 30', corresponding to the aforementioned output transistors in FIG. 1, are respectively mounted along the front edge 46 in the recessed regions, as depicted in FIGS. 2 and 3.

FIGS. 4 and 5 respectively illustrate front and side views of a single output transistor 58. The body of transistor 58 is represented by rectangle 60 carried by a mounting bracket 62 having outwardly extending arms 64, 66. The arms 64, 66 are recessed to accommodate threaded fasteners 68 for mounting the transistor in one of the aforementioned recessed regions formed in the subassembly front edge 46. A collector 70 and an emitter 72 extend from the transistor body 60 and are intended to be bent over to electrically contact planar circuit paths 74 formed on the surface of rigid structure 44, as will be discussed further hereinafter.

The subassembly 40 is configured to be mounted in a conductive housing 80 comprised of a peripheral wall 82, a housing bottom plate 86 (FIG. 7), and a removable cover plate 88. The housing 80 defines an interior volume 90.

Figure 6:
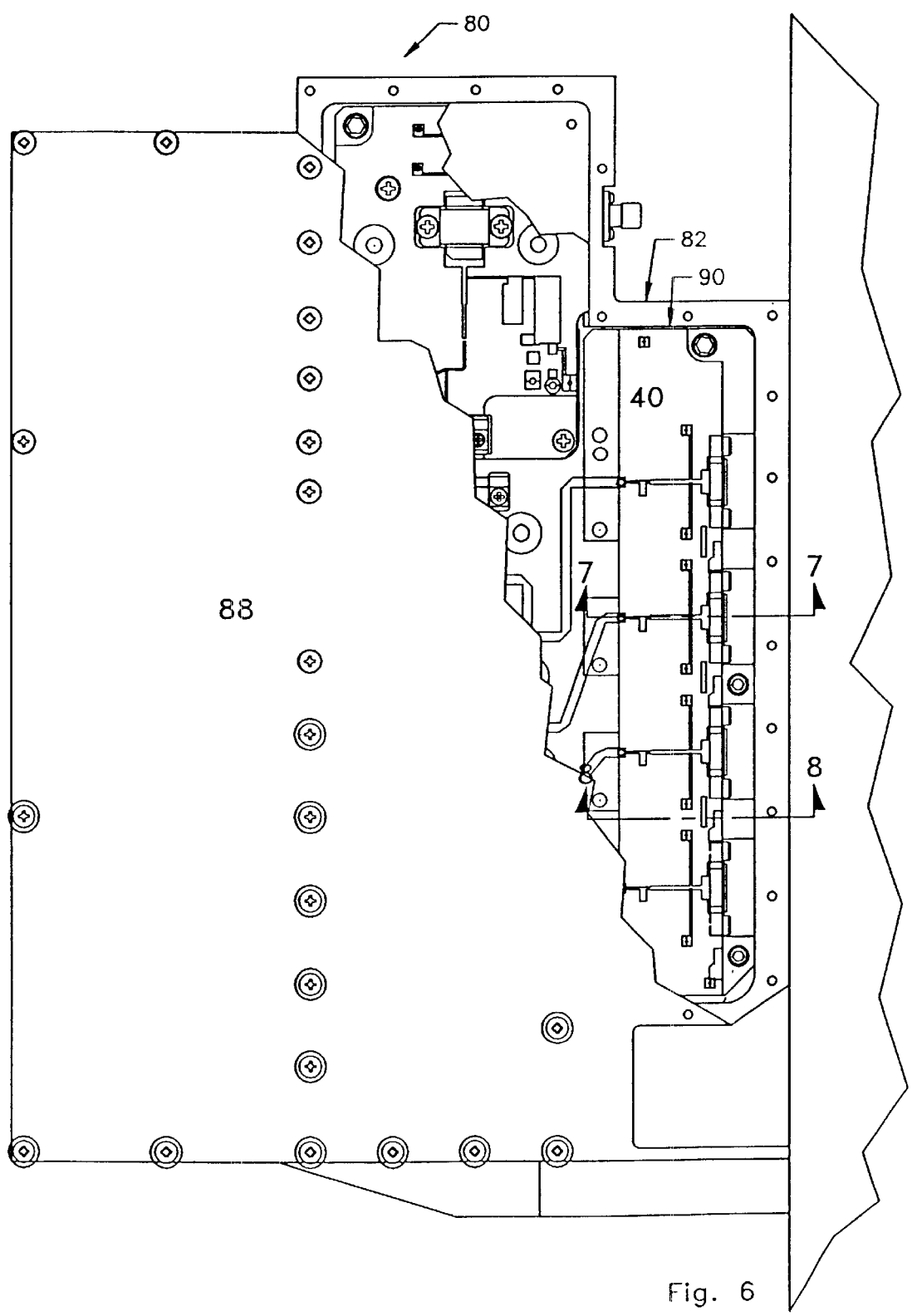
FIG. 6 is a plan view of the subassembly of FIG. 2 mounted in an amplifier module housing (cover plate partially broken away) adjacent to a cold plate heat sink surface.
Figure 7:
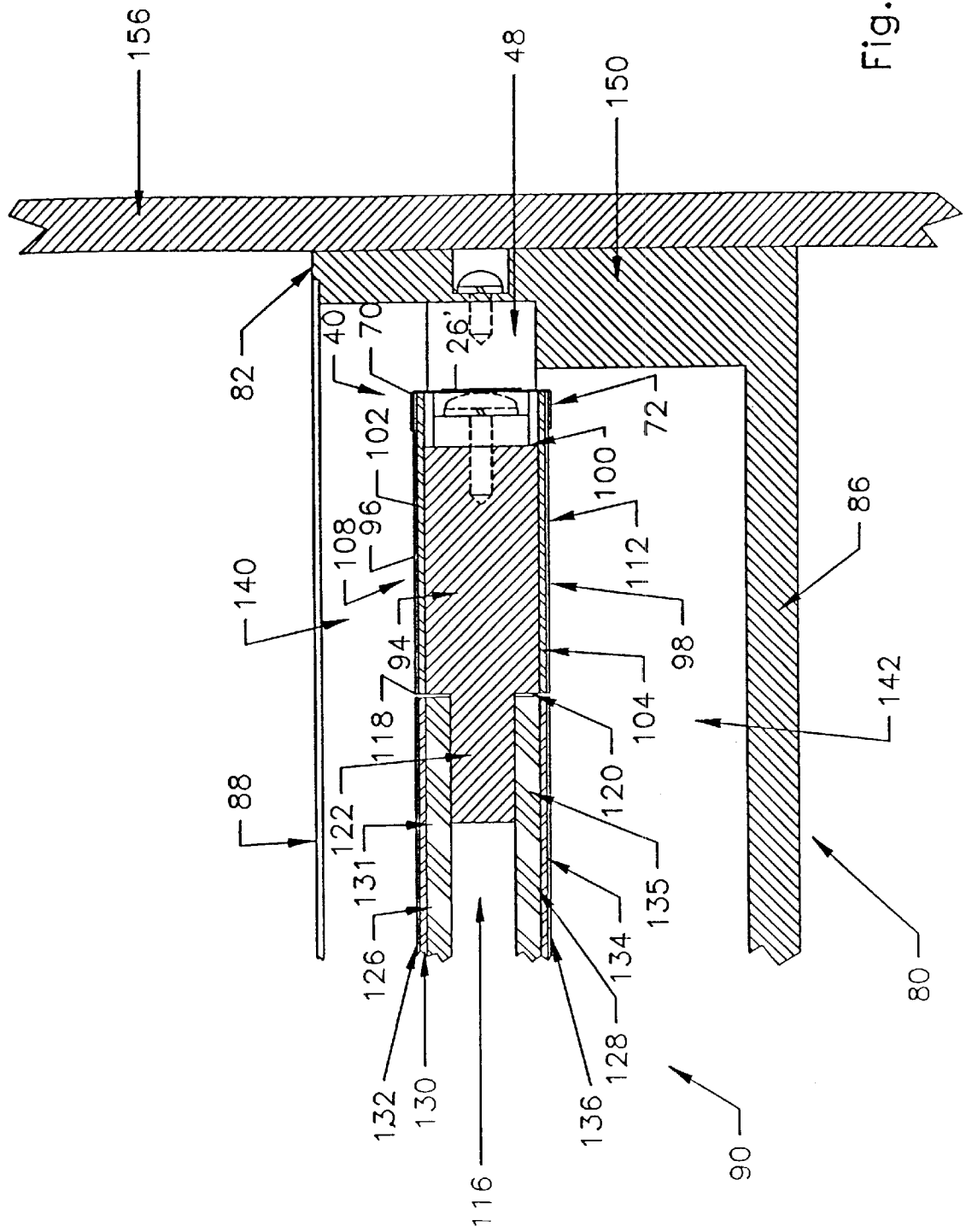

Attention is now directed to FIGS. 7 and 8 which comprise sectional views taken through FIG. 6. Note that the rigid structure 40 comprises a conductive substrate 94 having an upper planar surface 96 and a lower planar surface 98 extending parallel thereto. An edge surface 100 extends perpendicularly between planar surfaces 96 and 98. Dielectric layers 102 and 104 are respectively formed on planar surfaces 96 and 98 for carrying microstrip circuit paths 106. More particularly, upper planar surface 96 and its dielectric layer 102 carry circuit paths 108 defining the input circuitry (110, FIG. 1) to the output transistors. Lower planar surface 98 and its dielectric layer 104 carry circuit paths 112 defining the output circuitry (114, FIG. 1) leading to the combiner circuit 32.

Note in FIG. 7 that the output transistor 26' is mounted in the recessed region 52 essentially engaged against the front edge surface 100 of substrate 94.

Also note how the collector 70 and emitter 72 are bent by substantially 90° for electrical connection respectively to the circuit paths 108 and 112 on the upper and lower planar surfaces of substrate 94.

Also note in FIGS. 7 and 8 that the rear portion 116 of substrate 94 is reduced to define an upper shoulder 118 and lower shoulder 120. Upper and lower rear planar surfaces 122 and 124 project rearwardly from shoulders 118 and 120, respectively, and accommodate circuit substrates 126 and 128. Substrate 126 has dielectric layer 130 formed on the outer surface 131 thereof which carries circuit paths 132 forming the aforementioned divider circuitry 22. Similarly, substrate 128 has dielectric layer 134 formed on the outer surface 135 thereof which carries circuit paths 136 forming the aforementioned combiner circuitry 32.

Further note in FIGS. 7 and 8 that the primary substrate 94 and mating circuit substrates 126, 128 are mounted in housing 80 spaced from both the housing bottom plate 86 and the housing cover plate 88. The substrates thus partition housing internal volume 90 to form separate isolated cavities, i.e., upper cavity 140 and lower cavity 142. Upper cavity encloses the circuit paths 108 defining the input circuitry 110 and isolates it from circuit paths 112 defining the output circuitry 114 enclosed by lower cavity 142. Isolation of the input and output circuitry avoids undesired feedback and enhances amplifier stability.

FIGS. 7 and 8 also depict the substrate studs 48 projecting forwardly to contact the housing peripheral wall 82. This positions the output transistors e.g., 26' mounted along substrate edge 46 in close proximity to the housing peripheral wall 82 providing a short and very effective thermal path. The housing wall 82 front portion 150 preferably contacts a cold plate heat sink surface 156 to efficiently dissipate heat from the aligned output transistors.

From the foregoing, it should now be appreciated that a preferred embodiment of a dual plane microstrip power amplifier has been described configured to enhance amplifier stability and reliability. The preferred embodiment is characterized by a conductive substrate having first and second parallel planar surfaces and an edge surface. Power output transistors are mounted along the edge surface and electrically connected to input circuitry carried by the second planar surface. The conductive substrate is mounted in a housing so as to define isolated cavities respectively containing the input circuitry and output circuitry. The output transistors aligned along the substrate edge surface are able to transfer heat via a short thermal path to the housing and to an adjacent heat sink.

Although the present invention has been described with reference to a single preferred embodiment, it is recognized that various modifications and alternatives will occur to those skilled in the art which are intended to fall within the spirit and scope of the invention as defined by the appended claims.

I claim:

1. A solid state amplifier comprising
   a conductive substrate having first and second parallel planar surfaces and an edge surface extending therebetween;
   at least one output transistor physically mounted adjacent to said edge surface;
   input circuitry mounted on said first planar surface and electrically connected to said output transistor;
   output circuitry mounted on said second planar surface and electrically connected to said output transistor;
   a conductive housing defining an interior volume; and wherein
   said substrate is mounted in said interior volume to define first and second isolated cavities respectively containing said input circuitry and said output circuitry.

2. The amplifier of claim 1 further including a heat sink plate; and wherein
   said heat sink plate is mounted adjacent to said edge surface for removing heat from said output transistor.

3. The amplifier of claim 1 further including first and second dielectric layers respectively formed on said first and second substrate planar surfaces; and wherein
   said input circuitry comprises a conductive path formed on said first dielectric layer; and
   said output circuitry comprises a conductive path formed on said second dielectric layer.

4. A microwave power amplifier module comprising:
   a conductive substrate having planar first and second parallel surfaces and an edge surface extending substantially perpendicular therebetween;
   first and second dielectric layers respectively formed on said first and second surfaces;
   a plurality of output transistors mounted along said edge surface;
   input microstrip circuitry carried by said first dielectric layer and electrically connected to said output transistors;
   output microstrip circuitry carried by said second dielectric layer and electrically connected to said output transistors;
   a conductive housing including a removable cover plate, said housing defining an interior volume; and wherein
   said substrate is mounted in said housing to partition said interior volume into a first cavity containing said input microstrip circuitry and a second cavity containing said output microstrip circuitry.

5. The amplifier module of claim 4 further including:
   a conductive plate mounted in close proximity to said edge surface for conducting heat away from said output transistors.

* * * * *